United States Patent [19]
Lee et al.

[11] Patent Number: 5,667,931
[45] Date of Patent: Sep. 16, 1997

[54] POSITIVE PHOTORESIST COMPOSITION CONTAINING QUINONE DIAZIDE 5-TRIAZINE ESTERIFICATION COMPOUND

[75] Inventors: Dae-Youp Lee, Seoul; Ki-Dae Kim, Daejon-si; Ji Hong Kim, Daejon-si; Seong-ju Kim, Daejeon-si, all of Rep. of Korea

[73] Assignee: Korea Kumho Petrochemical Co., Ltd., Seoul, Rep. of Korea

[21] Appl. No.: 603,527

[22] Filed: Feb. 16, 1996

Related U.S. Application Data

[63] Continuation-in-part of Ser. No. 379,188, Jan. 27, 1995, abandoned.

[51] Int. Cl.$^6$ .................................................. G03F 7/023
[52] U.S. Cl. ........................... 430/191; 430/192; 430/193
[58] Field of Search ................................. 430/190, 191, 430/192, 193

[56] References Cited

U.S. PATENT DOCUMENTS

| | | |
|---|---|---|
| 4,626,492 | 12/1986 | Eilbeck ............................. 430/192 |
| 4,889,788 | 12/1989 | Stahlhofen et al. ............... 430/191 |

*Primary Examiner*—Christopher G. Young
*Attorney, Agent, or Firm*—Harrison & Egbert

[57] ABSTRACT

A positive photoresist composition, including an alkali soluble novolak resin, an esterification compound represented by the following formula II as a photosensitive agent and a solvent:

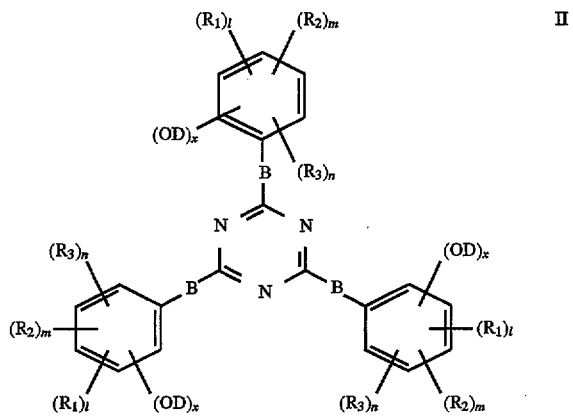

wherein $R_1$ through $R_3$ are independently selected from a hydrogen atom, an alkoxy group and an alkyl group containing 1 to 4 carbon atoms and are different from or the same as one another, and x is 1 to 4, l+m+n+x is 4;

B is selected from oxygen, methyl oxygen and ethyl oxygen; and

D represents

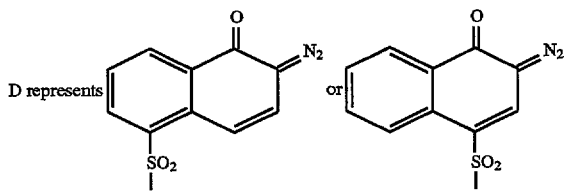

2 Claims, No Drawings

POSITIVE PHOTORESIST COMPOSITION CONTAINING QUINONE DIAZIDE 5-TRIAZINE ESTERIFICATION COMPOUND

RELATED APPLICATIONS

The present application is a continuation-in-part of U.S. patent application Ser. No. 08/379,188, now abandoned, filed on Jan. 27, 1995, and entitled "POSITIVE PHOTORESIST COMPOSITION".

BACKGROUND OF THE INVENTION

1. Field of the Invention

The present invention relates, in general, to novel photoresist compositions useful for fabrication of semiconductor device and, more particularly, to an improvement in thermal resistance, resolution and sensitivity as well as light absorption at a band of i-line (wavelength 365 nm), along with the novel photoresist compositions.

2. Description of the Prior Art

As high integration of semiconductor device has been accelerated in the last few years, fine image-forming technologies useful for fabrication of semiconductor device become highly precise. Correspondingly, photoresist used in the fine image-forming technologies is required to have a combination of high sensitivity, high resolution, and superior thermal resistance.

As a fine image-forming technology, there is extensively employed a lithography technology which takes advantage of a g-line with a wavelength of 436 nm and an i-line with a wavelength of 365 nm from a mercury lamp, a light source. In addition, there are various methods, what is called, next generation lithography technology, using an excimer laser (KrF, wavelength 248 nm), an X-ray and an electron beam.

Phenol novolak/naphthoquinone diazide-benzophenone resist compositions are widely used for photoresist for UV (g-line, i-line). In these resist compositions, the benzophenone compounds serve as ballast and are exemplified by dihydroxy benzophenone, trihydroxy benzophenone, tetrahydroxy benzophenone and so on, as introduced in many patents, for example, U.S. Pat. Nos. 3,666,473, 4,115,128, 4,409,314 and 4,439,516, and Japanese Patent Laid-Open Publication Nos. Sho. 61-45240, Sho. 61-118744 and Sho. 62-280737. Herein, ballast means a kind of a latent compound which can function as a photosensitive agent through ether reaction of its photosensitive group, that is to say, a precursor compound having a photosensitive group.

However, since these exemplified compounds absorb light at a band of i-line which is most extensively used at present, the resulting photoresists are poor in transparency, which, in turn, deleteriously affects profile or resoultion. In addition, the exemplified benzophenone compounds have low solubilities in resist solutions.

It is generally required that a photosensitive agent used in photoresist be of high resolution, high sensitivity, superior thermal resistance, good pattern characteristic as well as superior compatibility with matrix resin. In last few years, various efforts have been made to synthesize such photosensitive agents as the above characteristics. For example, a research proceeded for a resist compound employing a polyhydroxy compound as a ballast (European Patent Laid-Open No. 0 440 238 $A_2$).

SUMMARY OF THE INVENTION

Accordingly, an object of the present invention is to overcome the above problems encountered in prior arts and to provide photoresist compositions, improved in employment at a band of i-line with superiority in thermal resistance, resolution, sensitivity and dissolution in resist solvent.

Based on the intensive research and study by the present inventors, the above objects could be accomplished by incorporating into a photoresist composition an appropriate esterification compound represented by the following formular II of a compound having triazine structure unites, a compound having a framework of —$(C=N)_3$—, represented by the following formular I, which is unabsorbent of light at a band of i-line in addition to being superior in thermal resistance and in solubility;

This invention is provided to positive photoresist composition comprising alkali soluble novolak resin as a film-forming materials, esterification compound represented by formular II as photosensitive agent, which is reacted of 1,2-naphtoquinone-2-diazide-5(or 4)-sulfonyl halides with a triazine compound represented by formular I and organic solvent.

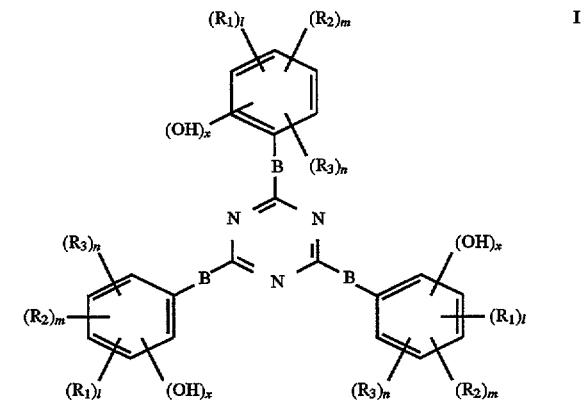

wherein $R_1$ through $R_3$ independently selected from a hydrogen atom, an alkoxy group or an alkyl group containing 1 to 4 carbon atoms and may be different from or the same with one another, and x is 1 to 4, l+m+n+x is 4; and B is selected from an oxygen, methyl oxygen and ethyl oxygen.

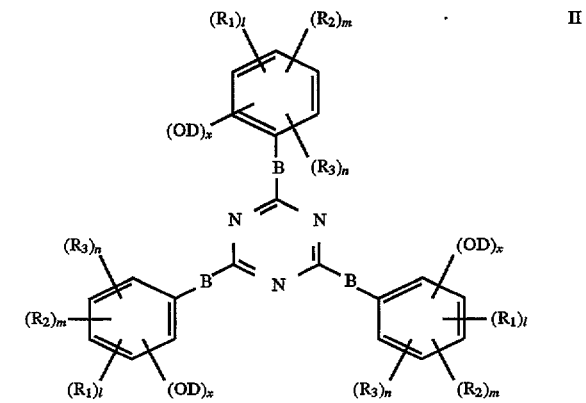

wherein $R_1$ through $R_3$ independently selected from a hydrogen atom, an alkoxy group or an alkyl group containing 1 to 4 carbon atoms and may be different from or the same with one another, and x is 1 to 4, l+m+n+x is 4;

B is selected from a oxygen, methyl oxygen and ethyl oxygen; and

D represents 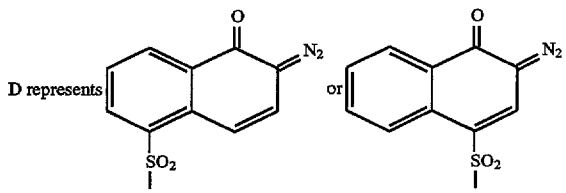

With the proviso that a compound of formular II is prepared by reacting 1,2-naphthoquinone-diazide-5(or 4)-sulfonyl halide with a compound of formular I wherein each of hydroxyl group.

In accordance with a further aspect of the present invention, there is provided a photoresist composition, further comprising at least one triazine compound represented by formular I as low molecular weight additive to increase solubility.

These and other objects together with others not specifically mentioned will become clear to those skilled in the art as the following description proceeds.

DETAILED DESCRIPTION OF THE INVENTION

Alkali soluble resins contained in the photoresist compositions of the present serve as film-forming materials. In the present invention, there is no particular limitation with regard to the alkali soluble resins and it is permitted to use alkali soluble novolak resins, typical film-forming materials in conventional positive photoresist compositon, which are prepared by condensing aromatic hydrocarbon compound, such as phenol, cresole or xylenol, with formaldehydes, in the presence of an acid catalyst.

Esterification compound of formular II as photosensitive agent is reacted triazine compound of formular I with 1,2-naphotoquinone-diazide-5(or 4)-sulfonyl halide. Triazine compounds of formula I particularly suitable for the present invention are 2,4,6-tri(4-hydroxyphenoxy)-1,3,5-triazine, 2,4,6-tri(3,5-dihydroxyphenoxy)-1,3,5-triazine, 2,4,6-tri(3,4,5-trihydroxyphenoxy)-1,3,5-triazine and so on.

For the preparation of 2,4,6-tri(4-hydroxyphenoxy)-1,3,5-triazine, cyanuric chloride is reacted with 4-methoxyphenol in the presence of a base catalyst to synthesize 2,4,6-tri(4-methoxyphenoxy)-1,3,5-triazine which is then subjected to hydrolysis. In the synthesis, sodium, sodium hydride, sodium carbonate, pyridine or triethyl amine is used as the base catalyst, and preferred is pyridine or triethyl amine. For the hydrolysis, N-methyl pyrrolidone, boron tribromide, boron trichloride, boron triiodide, iodotrimethyl silane or lithium diphenylphosphite may be used, and of these compounds, boron tribromide, boron trichloride and boron triiodide are preferred.

For synthesis of 2,4,6-tri[4-(1,2-naphthoquinone-2-diazide-5-sulfonyloxy)phenoxy]-1,3,5-triazine as the photosensitive agent useful in the present invention, 2,4,6-tri(4-hydroxyphenoxy)-1,3,5--triazine is reacted with 1,2-naphthoquinone-2-diazide-5-sulfonyl chloride in the presence of a base catalyst. Examples of the base catalyst useful to synthesize the photosensitive agent of the present invention include pyridine, triethyl amine, sodium hydroxycarbonate and sodium carbonate and preferred are triethyl amine and pyridine.

As the organic solvent, there are exemplified ethylene glycol, cyclohexanone, ethylene glycolmonoalkyl ether and acetates thereof, and ethyl lactate. These solvents are preferably used alone, but a mixture of 2 species may, if necessary, be used.

With regard to photoresist, it is prepared by dissolving alkali soluble novolak resin and 2,4,6-tri[alkyl(1,2-naphthoquinone-2-diazide-5-sulfonyloxy)phenoxy]-1,3,5-triazine represented by formular II in an organic solvent.

Also photoresist is prepared by dissolving further comprising at least one triazine compound represented by formular I which would act as a low molecular weight additive.

The preferred embodiments of the present invention will now be further described with reference to specific examples.

EXAMPLE 1

4.20 g of cyanuric chloride, 11.40 g of 4-methoxyphenol, and sodium carbonate were dispersed in benzene, and this dispersion proceeded into reaction at 80° C. for 24 hours. The substance produced was washed twice with ethyl acetate and then, filtered. The solid filtrate was extracted twice in 10% sodium carbonate and subsequently, twice in water. Concentration produced 10.4 g crystals of white 2,4,6-tri(4-methoxyphenoxy)-1,3,5-triazine.

The synthesized 2,4,6-tri(4-methoxyphenoxy)-1,3,5-triazine was analyzed with a Fourier transform-infrared spectrometer (hereinafter referred to as "FT-IR"), a proton-nuclear magnetic resonance spectrometer (hereinafter referred to as "$^1$H-NMR"), and a carbon-nuclear magnetic resonace spectrometer (hereinafter referred to as "$^{13}$C-NMR").

2.90 g of 2,4,6-tri(4-methoxyphenoxy)-1,3,5-triazine was dissolved in 70 ml of dichloromethane, and to this solution was added dropwise 1.63 g of boron tribromide, to prepare 2,4,6-tri(4-hydroxyphenoxy)-1,3,5-triazine. Purification was carried out by washing the prepared material 3 to 5 times with distilled water and then 1.96 g of 2,4,6-tri(4-hydroxyphenoxy)-1,3,5-triazine was obtained.

Analysis for 2,4,6-tri(4-hydroxyphenoxy)-1,3,5-triazine prepared was executed with FT-IR, $^1$H-NMR and $^{13}$C-NMR.

EXAMPLE 2

The 2,4,6-tri(4-methoxyphenoxy)-1,3,5-triazine was synthesized in a similar manner to that of Example 1, except that triethyl amine was used in place of sodium carbonate.

FT-IR, $^1$H-NMR and $^{13}$C-NMR were used for analysis of the 2,4,6-tri(4-methoxyphenoxy)-1,3,5-triazine synthesized.

5.81 g of 2,4,6-tri(4-methoxyphenoxy)-1,3,5-triazine was dissolved in 150 ml of dichloromethane, and to this solution was added dropwise a solution containing 3.26 g of boron tribromide in 70 ml of dichloromethane, to prepare 2,4,6-tri(4-hydoxyphenoxy)-1,3,5-triazine which was then washed 3 to 5 times with distilled water and then 4.58 g of 2,4,6-tri(4-hydroxyphenoxy)-1,3,5-triazine was obtained.

Analysis for the synthesis state of 2,4,6-tri(4-hydroxyphenoxy)-1,3,6-triazine was carried out with FT-IR, $^1$H-NMR and $^{13}$C-NMR.

EXAMPLE 3

The 2,4,6-tri(4-hydroxyphenoxy)-1,3,5-triazine prepared in Examples 1 and 2 was reacted with 1,2-naphthoquinone-2-diazide-5-sulfonyl chloride in such a manner than the mole ratio of the former to the latter was 1:3, in the presence of triethyl amine, a catalyst. 2,4,6-tri[4-(1,2-naphthoquinone-2-diazide -5-sulfonyloxy)phenoxy]-1,3,5-triazine thus synthesized was purified by washing with methyl alcohol.

EXAMPLE 4

Synthesis of 2,4,6-tri(3,5-dimethoxyphenoxy)-1,3,5-triazine was accomplished in a similar manner to that of Example 2, except that 13.88 g 3,5-dimethoxyphenol was used in place of 4-methoxyphenol.

The synthesized 2,4,6-tri(3,5-dimethoxyphenoxy)-1,3,5-triazine was analyzed with FT-TR, $^1$H-NMR and $^C$-NMR.

After dissolving the synthesized 2,4,6-tri(3,5-dimethoxyphenoxy)-1,3,5-triazine, boron tribromide was added dropwise into the solution, to prepare 2,4,6-tri(3,5-dihydroxyphenoxy)-1,3,5-triazine which was then washed with distilled water. And then 10.87 g 2,4,6-tri(3,5-dihydroxyphenoxy)-1,3,5-triazine was obtained.

Analysis for the synthesis state of 2,4,6-tri(3,5-dihydroxyphenoxy)-1,3,5-triazine prepared was carried out with FT-IR, $^1$H-NMR and $^{13}$C-NMR.

EXAMPLE 5

The 2,4,6-tri(3,5-dihydroxyphenoxy)-1,3,5-triazine obtained in Example 4 was reacted with 1,2-naphthoquinone-2-diazide-5-sulfonyl chloride in a similar manner to that of Example 3, except that the mole ratios of the former to the latter were 1:5, 1:6 and 1:7. 2,4,6-tri[3,5-di(1,2-naphthoquinone-2 -diazide-5-sulfonyloxy)phenoxy]-1,3,5-triazine thus synthesized at each mole ratio was purified by reprecipitation in a mixture of methyl alcohol and distilled water and in sole methyl alcohol.

EXAMPLE 6

14.03 g of 2,4,6-tri(3,4,5-trimethoxyphenoxy)-1,3,5-triazine was synthesized in a similar manner to that of Example 2, except that 16.58 g of 3,4,5-trimethoxyphenol was used instead of 4-methoxyphenol. The synthesis state thereof was confirmed with FT-IR, $^1$H-NMR and $^{13}$C-NMR.

This 2,4,6-tri(3,4,5-trimethoxyphenoxy)-1,3,5-triazine obtained was dissolved in dichloromethane, and to the solution was boron tribromide added dropwise, to prepare 2,4,6-tri(3,4,5-trihydroxyphenoxy)-1,3,5-triazine. Purification was carried out by washing the synthesis materials several times with distilled water. And then 9.63 g of 2,4,6-tri(3,4,5-trihydroxyphenoxy)-1,3,5-triazine was obtained.

Analysis for the synthesis stole thereof was executed with FT-IR, $^1$H-NMR and $^{13}$C-NMR.

EXAMPLE 7

The 2,4,6-tri(3,4,5-trihydroxyphenoxy)-1,3,5-triazine prepared in Example 6 was reacted with 1,2-naphthoquinone-2-diazide-5-sulfonyl chloride in such a manner that the mole ratios of the former to the latter were 1:6, 1:8, 1:9 and 1:10. 2,4,6-tri[3,4,5-tri(1,2-naphthoquinone-2-diazide-5-sulfonyloxy)phenoxy]-1,3,5-triazine thus synthesized at each mole ratio was purified by reprecipitation in a mixture of methyl alcohol and distilled water and in sole methyl alcohol.

EXAMPLE 8

In the presence of a catalyst, 4.20g of cyanuric chloride was reacted with 12.44 g of 2-methoxy-4-methylphenol, to synthesize 11.13 g of 2,4,6-tri(2-methoxy-4-methylphenoxy)-1,3,5-triazine which was analyzed with FT-IR, $^1$H-NMR and $^{13}$C-NMR.

11.90 g of 2,4,6-tri(2-methoxy-4-methylphenoxy)-1,3,5-triazine synthesized was dissolved in 200 ml of dichloromethane, and then, to this solution was added dropwise 6.02 g of boron tribromide, to prepare 2,4,6-tri(2-hydroxy-4-methylphenoxy)-1,3,5-triazine. This prepared material was washed 3 to 5 times with distilled water. And then 9.29 g of 2,4,6-tri(2-hydroxy-4-methylphenoxy)-1,3,5-triazine was obtained.

The prepared 2,4,6-tri(2-hydroxy-4-methylphenoxy)-1,3, 5-triazine was analyzed with FT-IR, $^1$H-NMR and $^{13}$C-NMR.

EXAMPLE 9

The 2,4,6-tri(2-hydroxy-4-methylphenoxy)-1,3,5-triazine prepared in Example 8 was reacted with 1,2-naphthoquinone-2-diazide-5-sulfonyl chloride in such a manner that the mole ratio of the former to the latter was 1:3, in the presence of triethyl amine, a catalyst. 2,4,6-tri[2-(1, 2-naphthoquinone-2-diazide-5-sulfonyloxy)-4-methylphenoxy]-1,3,5-triazine thus synthesized was purified by washing with methyl alcohol several times.

EXAMPLE 10

10 g of phenolic novolak resin, and 2.5 g of 2,4,6-tri[4-(1,2-naphthoquinone-2-diazide-5-sulfonyloxy)phenoxy]-1, 3,5-triazine obtained in Example 3, a dissolution-retardant, were dissolved in 32.5 g of ethylene glycolmonoether acetate solvent and filtered by a filter of 0.2 µm, to prepare resist. Using a spin-coater, the filtered solution was coated on a silicon wafer in a thickness of 1 µm and then, prebaked at a temperature of 100° C. for 1 minute. After being exposed to i-line (wavelength 365 nm) at a dose of 150 to 300 mJ/cm$^2$, the silicon wafer coated was subjected to thermal treatment at a 120° C. for a period of 40 to 60 seconds. Development in 2.38 wt % tetraammonium hydroxide yielded a positive pattern superior in resolution.

EXAMPLE 11

10 g of phenolic novolak resin, and 2.7 g of 2,4,6-tri[3,5-di(1,2-naphthoquinone-2-diazide-5-sulfonyloxy)phenoxy]-1,3,5-triazine prepared in Example 5, a dissolution-retardant, were dissolved in 33.0 g of ethylene glycolmonoether acetate solvent and filtered. Using a spin-coater, the filtered solution was coated on a silicon wafer in a thickness of 1 µm and then, prebaked at 100° C. for 1 minute. After being exposed to i-line at a close of 150 to 250 mJ/cm$^2$, the silicon wafer coated was subjected to thermal treatment at 100° C. for a period of 40 to 60 seconds. Development in 2.38 wt % tetraammonium hydroxide yielded a positive pattern superior in resolution.

EXAMPLE 12

5 g of phenolic novolak resin, and 1.25 g of 2,4,6-tri[3, 4,5-tri(1,2-naphthoquinone-2-diazide-5-sulfonyloxy) phenoxy]-1,3,5-triazine prepared in Example 7, a dissolution-retardant, were dissolved in 16.25 g of ethylene glycolmonoether acetate solvent, to prepare resist. After filtration, the resulting solution was coated on a silicon wafer in a thickness of 1 μm by a spin-coater and then, prebaked at 100° C. for 1 minute. Following exposure to i-line at a dose of 150 to 250 mJ/cm², the silicon wafer coated was subjected to thermal treatment at 100° C. for 60 seconds. Development in 2.38 wt % tetraammonium hydroxide yielded a positive pattern superior in resolution.

EXAMPLE 13

10 g of phenolic novolak resin, 2.00 g of 2,4,6-tri[4-(1,2-naphthoquinone-2-diazide-5-sulfonyloxy)phenoxy]-1,3,5-triazine prepared in Example 3 functioning as a dissolution-retardant and 0.5 g of 2,4,6-tri(2,6-dihydroxyphenoxy)-1,3,5-triazine which would act as a low molecular weight additive to increase the solubility were dissolved in 16.25 g of ethylene glycolmonoether acetate solvent, to prepare resist. After being filtered, the resulting solution was coated a silicon wafer in a thickness of 1 μm by a spin-coater and then, prebaked at 100° C. for 1 minute. Following exposure to i-line (wavelength 365 nm) at a dose of 150 to 300 mJ/cm², the silicon wafer coated was subjected to thermal treatment at a temperature of 100 ° C. for 60 seconds. Development in 2.38 wt % tetraammonium hydroxide for 90 seconds yielded a positive pattern superior in resolution.

Comparition Example 1

The dihydroxybenzophenone was reacted with 1,2-naphthoquinone-2-diazide-5-sulfonyl chloride in such a manner than the mole ratio of the former to the latter was 1:2, in the presence of triethyl amine, a catalyst. di(1,2-naphthoquinone-2-diazide-5-sulfonyloxy)benzophenone thus synthesized was purified by washing with methyl alcohol.

Comparition Example 2

The trihydroxybenzophenone was reacted with 1,2-naphthoquinone-2-diazide-5-sulfonyl chloride in such manner than the mole ratio of the former to the latter was 1:3, in the presence of triethyl amine, a catalyst. tri(1,2-naphthoquinone-2-diazide-5-sulfonyloxy)benzophenone thus synthesized was purified by washing with methyl alcohol.

Comparition Example 3

The tetrahydroxybenzophenone was reacted with 1,2-naphthoquinone-2-diazide-5-sulfonyl chloride in such a manner than the mole ratio of the former to the latter was 1:4, in the presence of triethyl amine, a catalyst. tetra(1,2-naphthoquinone-2-diazide-5-sulfonyloxy)benzophenone thus synthesized was purified by washing with methyl alcohol.

The ballast of the present invention was tested for sensitivity and thermal resistance and the results are given as shown in the following Table 1 and, along with the physical properties of conventional photoresist compositions.

TABLE 1

| | Material | ε (1/mol · cm) Sensitivity |
|---|---|---|
| Example 3 | tri(HP)Triazine + NAC-5 | 28,000 |
| Example 5 | tri(DHP)Triazine + NAC-5 | 45,000 |
| Example 7 | tri(THP)Triazine + NAC-5 | 74,000 |
| Example 9 | tri(2H4MP)Triazine + NAC-5 | 28,000 |

TABLE 1-continued

| | Material | ε (1/mol · cm) Sensitivity |
|---|---|---|
| Comparition 1 | di-HBP + NAC-5 | 20,000 |
| Comparition 2 | tri-HBP + NAC-5 | 24,000–26,000 |
| Comparition 3 | tetra-HBP + NAC-5 | 32,000–36,000 |

Footnote:
NAC-5: 1,2-naphtoquinone-2-diazide-5-sulfonyl chloride
di-HBP: dihydoxybenzophenone
tri-HBP: trihydroxybenzophenone
tetra-HBP: tetrahydoxybenzophenone
tri(HP)Triazine: 2,4,6-tri(4-hydroxyphenoxy)-1,3,5-triazine
tri(DHP)Triazine: 2,4,6-tri(3,5-dihydroxyphenoxy)-1,3,5-triazine
tri(THP)Triazine: 2,4,6-tri(3,4,5-trihydroxyphenoxy)-1,3,5-triazine
tri(2H4MP)Triazine: 2,4,6-tri(2-hydroxy-4-methylphenoxy)-1,3,5-triazine

TABLE 2

| | Material | Melting Point (°C.) |
|---|---|---|
| Example 1 | tri(HP)Triazine | 227 |
| Example 4 | tri(DHP)Triazine | 235 |
| Example 6 | tri(THP)Triazine | 240 |
| Example 8 | tri(2H4MP)Triazine | 229 |
| Comparition 2 | tri-HBP | 137–144 |
| Comparition 3 | tetra-HBP | 200–218 |

As apparent from the tables, the photoresist composition according to the present invention exhibits excellent effects in sensitivity and thermal resistance relative to conventional ones. For example, in melting point, the ballast of the present invention is higher by from 19° even to 103° C. than conventional one. This high melting point presents good thermal resistance to the resulting resist, so that the resist is rarely decomposed upon baking, which prevents distortion of pattern.

As to dissolution property in resist solvent, photosensitive agents from conventional ballast, for example, tetrahydroxybenzophenone wherein all photosensitive groups are substituted have a solubility of about 20%, while those from present ballast, e.g. triazine compounds in which all photosensitive groups are substituted, have a solubility of about 100%.

In addition, it is proved that the ballast according to the present invention is superior to conventional ones in resolution and dissolution retardancy.

Other features, advantages and embodiments of the invention disclosed herein will be readily apparent to those exercising ordinary skill after reading the foregoing disclosures. In this regard while specific embodiments of the invention have been described in considerable detail, variations and modifications of these embodiments can be affected without departing from the spirit and scope of the invention as described and claimed.

What is claimed is:

1. A positive photoresist composition comprising an alkali soluble novolak resin and an esterification compound in an admixture wherein said esterification compound is represented by the following Formula II as a photosensitive agent and a solvent:

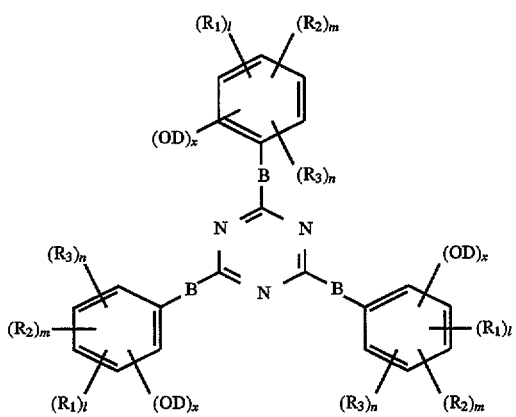

wherein $R_1$ through $R_3$ are independently selected from a group consisting of a hydrogen atom, an alkoxy group containing 1 to 4 carbon atoms, and an alkyl group containing 1 to 4 carbon atoms and wherein $R_1$ through $R_3$ are different from or the same as one another, and x is 1 to 4, l+m+n+x totals 4 with 1 and m and n each selected from 0 through 3;

B is selected from a group consisting of oxygen, methyl oxygen and ethyl oxygen; and D represents

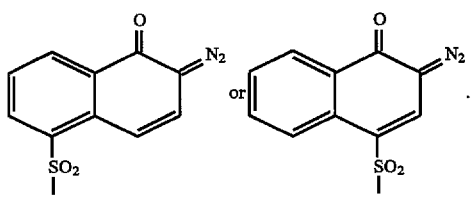

2. A positive photoresist composition in accordance with claim 1, further comprising a compound represented by the following Formula I which acts as a weight additive for increasing solubility:

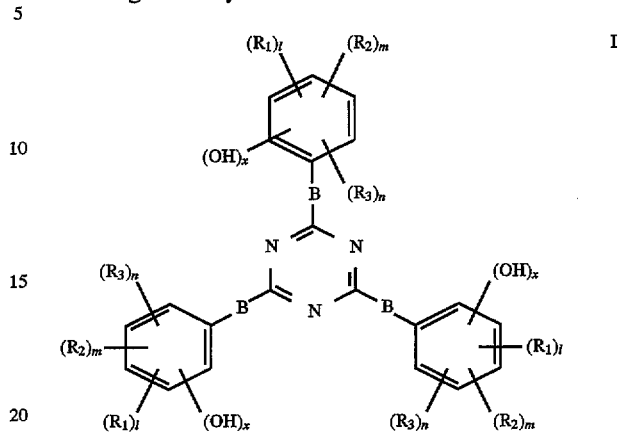

wherein $R_1$ through $R_3$ in Formula I are independently selected from a group consisting of a hydrogen atom, an alkoxy group containing 1 to 4 carbon atoms, and an alkyl group containing 1 to 4 carbon atoms and wherein $R_1$ through $R_3$ are different from or the same as one another, and x in Formula I is 1 to 4, l+m+n+x in Formula I totals 4 with 1 and m and n in Formula I each selected from 0 through 3;

B in Formula I is selected from a group consisting of oxygen, methyl oxygen and ethyl oxygen.

* * * * *